United States Patent [19]

Yamaha et al.

[11] Patent Number: 5,641,993

[45] Date of Patent: *Jun. 24, 1997

[54] SEMICONDUCTOR IC WITH MULTILAYERED AL WIRING

[75] Inventors: Takahisa Yamaha; Masaru Naito, both of Hamamatsu, Japan

[73] Assignee: Yamaha Corporation, Hamamatsu, Japan

[*] Notice: The term of this patent shall not extend beyond the expiration date of Pat. No. 5,428,251.

[21] Appl. No.: 375,125

[22] Filed: Jan. 17, 1995

Related U.S. Application Data

[63] Continuation of Ser. No. 36,940, Mar. 25, 1993, abandoned.

[30] Foreign Application Priority Data

Mar. 28, 1992 [JP] Japan .................... 4-102306

[51] Int. Cl.⁶ .................................. H01L 23/48
[52] U.S. Cl. .......................... 257/765; 257/767
[58] Field of Search .................. 257/758, 765, 257/771, 774, 750, 767

[56] References Cited

U.S. PATENT DOCUMENTS

| | | | |
|---|---|---|---|
| H274 | 5/1987 | Ruggerio | 257/774 |
| 4,206,472 | 6/1980 | Chu et al. | 257/765 |
| 4,924,295 | 5/1990 | Küecher | 257/758 |
| 4,937,652 | 6/1990 | Okumura et al. | 257/765 |
| 4,976,809 | 12/1990 | Broadbent | 257/771 |
| 4,989,064 | 1/1991 | Kubokoya et al. | 257/771 |
| 5,018,001 | 5/1991 | Kondo et al. | 257/771 |
| 5,184,205 | 2/1993 | Shibata | 257/765 |
| 5,187,561 | 2/1993 | Hasunuma et al. | 257/771 |
| 5,428,251 | 6/1995 | Naito et al. | 257/765 |

FOREIGN PATENT DOCUMENTS

| | | | |
|---|---|---|---|
| 02137230 | 5/1990 | Japan | 257/765 |
| 02267940 | 11/1990 | Japan | 257/765 |
| 04157764 | 5/1992 | Japan | 257/765 |

OTHER PUBLICATIONS

Howard et al., Fabrication of Intermetallic Diffusion Barrier for Electromigration in Narrow–Linesstnipes. IBM TDB vol. 20, No. 9, Feb. 1978, pp. 3477–3499.

IBM TDB vol. 20, No. 9, 2178 Fabrication of Intermetallic Diffusion Barrier for Electromigration in Narrow–Line Stripes, Howard et al, pp. 3477–3499.

Yamaha, Takahisa, et al., "Three Kinds of Via Electromigration Failure Mode In Multilevel Interconnections", Institute of Electrical and Electronics Engineers, Inc., San Diego, Ca., Mar.–Apr., 1992, pp. 349–355.

Yamaha, Masahisa, et al., The Institute of Electronics, Information and Communication Engineers, Technical Report vol. 91, No. 332, (1991) pp. 43–44.

Thin Film Handbook, p. 179, edited by Japan Gakujutu Shinkokai.

Primary Examiner—Mahshid D. Saadat
Assistant Examiner—T. M. Arroyo
Attorney, Agent, or Firm—Loeb & Loeb LLP

[57] ABSTRACT

On an insulating film covering the surface of a semiconductor substrate, a lower wiring layer made of Al or Al alloy is formed. An insulating film having a contact hole is formed on the lower wiring layer and the substrate. An upper wiring layer made of Al or Al alloy is formed on the insulating film and connected to the lower wiring layer via the contact hole. In such a multilayered wiring structure, the size of Al grain of the lower wiring layer, at least at the surface just under the contact hole, is made smaller than the bottom size of the contact hole. With this setting, Al atoms are supplied sufficiently from the lower wiring layer to the interface between the lower and upper wiring layers, preventing wiring disconnection caused by the peeling off of the interface.

20 Claims, 2 Drawing Sheets

SEMICONDUCTOR IC WITH MULTILAYERED AL WIRING

This is a continuation of application Ser. No. 08/036,940, filed Mar. 25, 1993, now abandoned.

BACKGROUND OF THE INVENTION a) Field of the Invention

The present invention relates to a multilayered wiring of an integrated circuit such as an LSI, and more particularly to an integrated circuit having a multilayered wiring made of Al or Al alloy.

b) Description of the Related Art

In a conventional multilayered wiring structure of an LSI, high temperature resistive conductive materials such as polysilicon and refractory metal silicide are used as the lower layer wiring, and high conductivity metals such as Al and Al alloy are used as the upper layer wiring. In order to further reduce the wiring resistance, it is preferable to use also Al or Al alloy as the lower layer wiring. In forming a multilayered wiring of Al or Al alloy only, a lower wiring layer of Al or Al alloy is first formed and then an interlayer insulating film such as $SiO_2$ is formed thereon. After forming a contact hole in the insulating film, an upper wiring layer of Al or Al alloy is formed on the insulating film to contact the upper wiring layer to the lower wiring layer via the contact hole.

Electro-migration (EM) at the contact area of such an Al multilayered wiring structure poses a significant issue. It has been believed that EM resistance can be improved by providing a better step coverage of the upper wiring layer at a contact hole.

However, even if the step coverage of the upper wiring layer is improved, the EM resistance will not necessarily be improved. The reason for this is conceivably that the generation of voids or peeling-off of the interface between the upper and lower wiring layers causes a wiring disconnection (for example, refer to Technical Report Vol. 91, No. 332, SDM 91-137 (1991), pp.43 to 44, The Institute of Electronics, Information and Communication Engineers).

SUMMARY OF THE INVENTION

It is an object of the present invention to provide an integrated circuit capable of preventing a generation of voids or peeling-off at the interface between an upper and lower wiring layer, as a result, improving EM resistance by improving the step coverage of an upper wiring layer.

It is another object of the present invention to provide a method of manufacturing an integrated circuit capable of improving EM resistance by improving the step coverage of an upper wiring layer.

According to an aspect of the present invention, there is provided an integrated circuit comprising a substrate having an insulating surface, a lower wiring layer made of Al or Al alloy and formed on the insulating surface, an insulating film covering the lower wiring layer and the insulating surface and having a contact hole at a position corresponding to a predetermined position of the lower wiring layer, and an upper wiring layer made of Al or Al alloy, formed on the insulating film, and connected via the contact hole to the lower wiring layer, wherein the grain size of Al of the lower wiring layer, at least at the surface area just under the contact hole, is set smaller than the bottom size of the contact hole.

In the case where one or a plurality of lower wiring layers are formed, a plurality of contact holes are formed at positions corresponding to predetermined positions of the lower wiring layers, and a plurality of upper wiring layers are formed and connected via the contact holes to the lower wiring layer or layers, the grain size of Al of the lower wiring layer or layers, at least at the surface area just under each contact hole, is set smaller than the minimum bottom size of the contact holes.

If a grain boundary can be positioned at the contact hole, Al atoms can be supplied through the grain boundary, But, it is practically impossible to locate each grain boundary at a desired position.

With the grain size of Al of the lower wiring layer just under the contact hole being set smaller than the bottom size of the contact hole, a grain boundary of Al necessarily appears at the interface between the upper and lower wiring layers. As a result, Al atoms are sufficiently supplied from the lower wiring layer to the interface. The wiring disconnection by the peeling off of the interface can therefore be prevented and the step coverage of the upper wiring layer is improved to provide a better EM resistance.

In the case where the grain size of Al is set to the minimum bottom size of a plurality of contact holes, it is easy to improve the EM resistance at all interlayer connection areas of an integrated circuit.

As described above, the EM resistance can be improved by setting the grain size of Al of the lower wiring layer, at the position just under each contact hole, smaller than the bottom size of the contact hole. It is therefore possible to realize an integrated circuit having a high reliability of wiring.

DETAILED DESCRIPTION OF THE PREFERRED EMBODIMENTS

Figure 1:
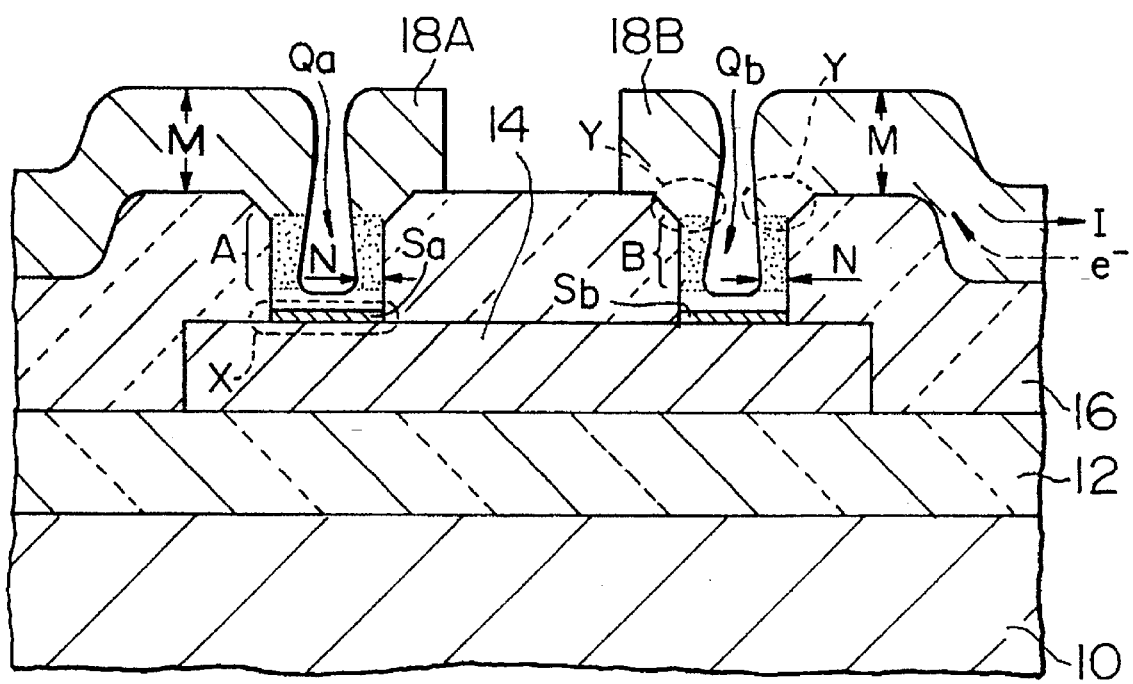
FIG. 1 is a cross sectional view explaining the wiring structure of an integrated circuit according to an embodiment of the present invention.

FIG. 1 is a schematic diagram in section explaining the wiring structure of an integrated circuit according to an embodiment of the present invention.

In this embodiment, the grain size of an Al alloy layer is controlled to be small enough, compared to the size of the contact hole, so that each contact hole will include at least one grain boundary.

Referring to FIG. 1, on the surface of a semiconductor substrate 10 such as silicon, an insulating film 12 such as silicon oxide is formed. On this insulating film 12, a lower wiring layer 14 such as Al or Al alloy is formed. On this lower wiring layer 14, another insulating film 16 such as silicon oxide is formed. Contact holes $Q_a$ and $Q_b$ are formed in the insulating film 16. Upper wiring layers 18A and 18B such as Al or Al alloy are connected via the contact holes $Q_a$ and $Q_b$ to the lower wiring layer 14 at its opposite end portions.

The interlayer insulating film 16 is formed on the under wiring layer 14 and insulating film 12, by a chemical vapor deposition (CVD) method or the like. The contact holes $Q_a$ and $Q_b$ are formed in the insulating film 16, by a selective dry etching process using a resist layer as a mask. After forming the contact holes $Q_a$ and $Q_b$, sputter cleaning is performed using $Ar^+$ ions or the like. Very thin boundary films Sa and Sb are present on the bottoms of the contact holes $Q_a$ and $Q_b$, these films containing by-products of the dry etching process of forming the contact holes, natural oxide films, and materials re-attached to the side walls of the contact holes during the sputter cleaning.

The wiring layer 14 is formed by depositing Al or Al alloy on the insulating film 12 by, for example, sputtering, and thereafter patterning the deposited film by selective etching. The wiring layers 18A and 18B are formed by forming the contact holes $Q_a$ and $Q_b$ in the insulating film 16, and thereafter patterning Al or Al alloy deposited on the surface in the similar manner to forming the wiring layer 14. The portions of the upper wiring layers 18A and 18B formed on the side walls of the contact holes of the interlayer insulating film are represented by A and B in FIG. 1. The thickness of the portions A and B of the upper wiring layers is represented by N, and the thickness of the upper wiring layers at the flat area is represented by M.

Figure 2:
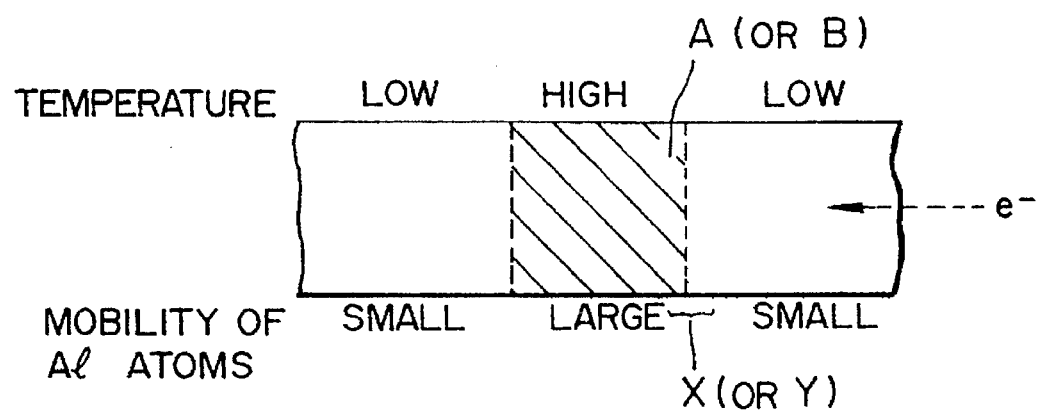
FIG. 2 is a schematic diagram explaining the motion of Al atoms at the high temperature area A (or B) and at the nearby area.

FIG. 2 illustrates the temperature distribution and Al atom mobility distribution obtained when a current I flows from the wiring layer 18A to the wiring layer 18B (when electrons $c^-$ flow in the opposite direction as indicated by the arrow). The cross sectional areas of the portions A and B of the upper wiring layers 18A and 18B on the side walls of the contact holes become smaller and the resistance at these areas increases, raising the temperature at these portions A and B. The mobility of Al atoms is low at the lower temperature region, and high at the higher temperature region. Al atoms are pushed by transporting electrons. The motion of Al atoms is not smooth at the region where the temperature gradient is sharp, such as the regions between the low temperature regions and high temperature regions at the portions A and B. Breakage of electrical connection is likely to occur at such a region. Comparing portion X with portion Y, the wiring disconnection at the portion X is dominant because the supply of Al atoms is limited by the boundary layer Sa. Next, an activation energy is calculated by measuring temperature dependency in order to examine the causes of disconnections. The wiring layer disconnects because atoms diffuse at the disconnection point. The diffusion phenomena comprise surface diffusion where metal atoms transfer along the metal surface, grain boundary diffusion where metal atoms transfer along grain boundaries, and internal diffusion where metal atoms transfer within the grains. The cause of the disconnections is decided by the dominant diffusion phenomenon. The activation energy calculated by measuring temperature dependency for the various diffusion phenomena is less than 0.3 eV, 0.4–0.6 eV, and greater than or equal to 0.8 eV, respectively.

The activation energy at the whole wiring layers, including the wiring layers 14 and 18A and disconnected at the portion X, was about 0.5 eV. This means that the dominant diffusion phenomenon in wiring disconnection is grain boundary diffusion which is caused by the motion of Al atoms along the grain boundary.

Figure 3:
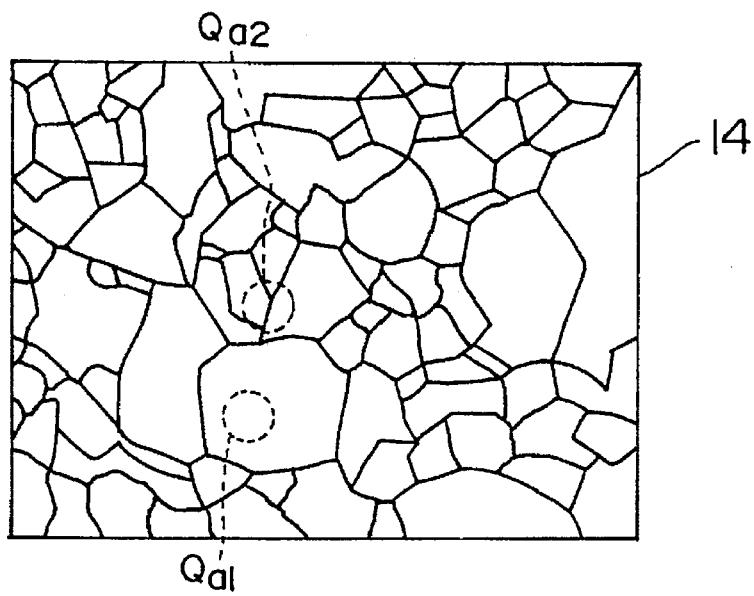
FIG. 3 is a plan view showing an example of the structure of a grain boundary on the surface of a lower wiring layer.

FIG. 3 shows examples of grain boundaries observed on the surface of the lower wiring layer 14. $Q_{a1}$ and $Q_{a2}$ represent contact holes of 1 µm diameter corresponding to the contact hole $Q_a$.

For the contact hole $Q_{a1}$, Al atoms are not supplied from the lower wiring layer 14 to the upper wiring layer 18A, so that the interface is peeled off or voids are generated at the portion X, causing wiring disconnection. The reason for this is attributable to the unbalanced supply of Al atoms at the interface between the lower and upper wiring layers 14 and 18A, caused by the grain boundary diffusion which is the main factor of wiring disconnection at the interface as described above.

For the contact hole $Q_{a2}$, Al atoms are supplied via Al grain boundaries from the lower wiring layer 14 to the upper wiring layer 18A, so that wiring disconnection by the interface peeling off is not likely to occur. The reason for this is that the grain boundaries at the contact hole $Q_{a2}$ supply Al atoms so as to balance with Al atoms moved by the grain boundary diffusion.

The size of each Al grain on the surface of the lower wiring layer 14, at least just under the contact hole $Q_a$ is set smaller than the bottom size of the contact hole $Q_a$. With this setting, Al atoms are sufficiently supplied via Al grain boundaries from the lower wiring layer 14 to the upper wiring layer 18A, preventing wiring disconnection otherwise caused by the interface peeling off.

It has been thought conventionally that the higher the step coverage factor C of the upper wiring layer, the higher the EM resistance. The step coverage factor C is defined by $C=N/M*100\%$ where N is the thinnest width of the upper wiring layer within a contact hole, and M is the thickness at the flat portion near the contact hole. However, if wiring disconnection occurs at the portion X before the disconnection occurs at the portion Y, the EM resistance will not be improved even if the step coverage factor C is made high.

If wiring disconnection caused by the interface peeling off at the portion X is prevented in the manner described above, the wiring disconnection at the portion Y becomes dominant. In this case, with a high step coverage factor C, the current density at the portion Y lowers correspondingly, improving the EM resistance.

Figure 4:
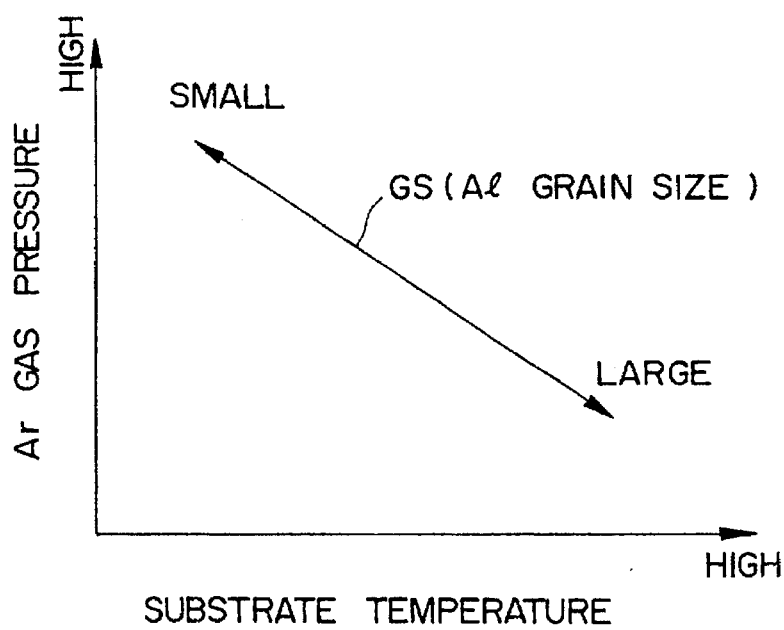
FIG. 4 is a graph showing the substrate temperature dependence and Ar gas dependence of Al grain size, during the sputtering process.

FIG. 4 shows the substrate temperature dependence and Ar gas pressure dependence of the Al grain size GS during the sputtering process. As seen from FIG. 4, as the substrate temperature is lowered or the Ar gas pressure is raised, the Al grain size becomes small.

An Al or Al alloy layer having a grain size smaller than the bottom size 1 µm of the contact hole $Q_a$ can be obtained by properly setting the substrate temperature and gas pressure during the sputtering process of depositing Al or Al alloy material of the lower wiring layer 14 on the substrate surface. For example, the substrate temperature is set to 150° C. or lower, and the gas pressure is set to 8 m Torr or higher. The Al or Al alloy layer is then patterned to obtain the lower wiring layer 14 having the grain size smaller than 1 µm.

The grain size of Al from the bottom to top surfaces of the lower wiring layer 14 may be made smaller than the bottom size of the contact hole, or the grain size of Al at the top surface only or at the surface just under the contact hole only may be made smaller than the bottom size of the contact hole.

In a substrate or chip formed with an integrated circuit, only an interlayer contact area having a high current density among a number of contact areas of the integrated circuit may be formed in accordance with the above-described proper settings of the substrate temperature and gas pressure. If all of a number of interlayer contact areas of the integrated circuit are to be formed in such a manner, the grain size of Al of all lower wiring layers is set smaller than the minimum bottom size of contact holes. This approach is easier than controlling the grain size of each interlayer contact area or area group independently.

We claim:

1. An integrated circuit comprising:

a substrate having an insulating surface thereon;

a lower wiring layer, including one of Al and Al alloy, having a grain size, said lower wiring layer formed on said insulating surface;

an insulating film covering said lower wiring layer and said insulating surface and having a contact hole therethrough at a position corresponding to a predetermined position of said lower wiring layer, said contact hole having a bottom having a diameter; and an upper wiring layer, including one of Al and Al alloy, formed on said insulating film, and connected via said contact hole to said lower wiring layer at an interface of the lower wiring layer and the upper wiring layer, wherein the grain size of said one of Al and Al alloy of said lower wiring layer, at least at the interface, is smaller than the diameter of the bottom of said contact hole and a grain boundary of said one of Al and Al alloy of the lower wiring layer contacts the upper wiring layer at the interface to prevent wiring disconnection at the interface of the lower wiring layer and the upper wiring layer.

2. The integrated circuit of claim 1, wherein the diameter of the bottom of said contact hole is about 1 μm or smaller.

3. The integrated circuit of claim 1, wherein the substrate includes silicon.

4. The integrated circuit of claim 1, wherein the insulating film includes silicon oxide.

5. The integrated circuit of claim 4, wherein the insulating film is formed by chemical vapor deposition.

6. An integrated circuit comprising:

a substrate having an insulating surface thereon;

one or more lower wiring layers each including at least one of Al and Al alloy, each having a grain size and each formed on said insulating surface;

one or more insulating films each covering each of said lower wiring layers, respectively, and said insulating surface and each having a contact hole therethrough at a position corresponding to a predetermined position of each of said lower wiring layers, respectively, each of the contact holes having a bottom having a diameter; and one or more upper wiring layers each including at least one of Al and Al alloy, each formed on each of said insulating films, respectively, and each connected via each of said contact holes to each of said lower wiring layers, respectively, at respective interfaces of each of said lower wiring layers and each of said upper wiring layers, wherein the grain size of said at least one of Al and Al alloy of each of said lower wiring layers, at least at the respective interfaces, is smaller than a minimum bottom diameter size of said contact holes and a grain boundary of each of the lower wiring layers contacts each of the upper wiring layers at the respective interfaces to prevent wiring disconnection at the respective interfaces of each of the lower wiring layers and each of the upper wiring layers.

7. The integrated circuit of claim 6, wherein the minimum bottom diameter size of said contact holes is about 1 μm or less.

8. The integrated circuit of claim 6, wherein the substrate includes silicon.

9. The integrated circuit of claim 6, wherein the one or more insulating films include silicon oxide.

10. The integrated circuit of claim 7, wherein the one or more insulating films are formed by chemical vapor deposition.

11. A wiring structure for a semiconductor device, the wiring structure comprising:

a semiconductor substrate;

a first metal wiring layer having a first grain size formed on the semiconductor substrate;

an interlayer insulating film formed on the lower metal wiring layer and having a contact hole therethrough, said contact hole having a diameter; and a second metal wiring layer formed on the interlayer insulating film and selectively connecting to the first metal wiring layer through the contact hole at an interface, wherein the first grain size of the first metal wiring layer is smaller than the diameter of the contact hole at the interface between the first and the second metal wiring layers and a grain boundary of the first metal wiring layer contacts the second metal wiring layer at the contact hole at the interface to prevent wiring disconnection at the interface of the first metal wiring layer and the second metal wiring layer.

12. The wiring structure of claim 11, wherein the first metal wiring layer and the second metal wiring layer include the same substance.

13. The wiring structure of claim 12, wherein the first metal wiring layer and the second metal wiring layer include one of aluminum and an aluminum alloy.

14. The wiring structure of claim 11, wherein the semiconductor substrate includes silicon.

15. The wiring structure of claim 11, wherein the insulating film includes silicon oxide.

16. The wiring structure of claim 15, wherein the insulating film is deposited by chemical vapor deposition.

17. The wiring structure of claim 11, wherein the diameter of the contact hole is about 1 μm.

18. The wiring structure of claim 11, wherein the diameter of the contact hole is less than about 1 μm.

19. The wiring structure of claim 18, wherein the first metal wiring layer includes aluminum and wherein the first metal wiring layer is deposited at a temperature of less than about 150° C.

20. The wiring structure of claim 19, wherein the first metal wiring layer is deposited at a pressure of greater than about 8 milliTorr.

* * * * *